United States Patent [19]
Horie et al.

[11] Patent Number: 5,621,239
[45] Date of Patent: Apr. 15, 1997

[54] SOI DEVICE HAVING A BURIED LAYER OF REDUCED RESISTIVITY

[75] Inventors: Hiroshi Horie; Atsushi Fukuroda; Yoshihiro Arimoto, all of Kawasaki, Japan

[73] Assignee: Fujitsu Limited, Kawasaki, Japan

[21] Appl. No.: 475,439

[22] Filed: Jun. 7, 1995

Related U.S. Application Data

[63] Continuation of Ser. No. 150,253, Nov. 10, 1993, abandoned, which is a continuation of Ser. No. 787,911, Nov. 5, 1991, abandoned.

[30] Foreign Application Priority Data

Nov. 5, 1990 [JP] Japan ................................ 2-299256
Jun. 3, 1991 [JP] Japan ................................ 3-130198

[51] Int. Cl.⁶ .......................... H01L 29/00; H01L 27/01
[52] U.S. Cl. ...................... 257/499; 257/347; 257/505; 257/526
[58] Field of Search ............................. 357/34; 257/347, 257/348, 349, 350, 351, 352, 353, 354, 507, 565, 575, 573, 584, 588, 197, 499, 505, 526

[56] References Cited

U.S. PATENT DOCUMENTS

| | | | |
|---|---|---|---|
| 4,864,377 | 9/1989 | Widdershoven | 257/347 |
| 5,095,351 | 3/1992 | Gotou | 357/34 |
| 5,113,236 | 5/1992 | Arnold et al. | 257/347 |
| 5,280,188 | 1/1994 | Iwasaki | 257/588 |

*Primary Examiner*—Carl Whitehead, Jr.
*Attorney, Agent, or Firm*—Staas & Halsey

[57] ABSTRACT

In a semiconductor device, first and second substrates are supported with respective first major surfaces in opposing, parallel and spaced relationship. A conductor layer of low resistivity material is provided on a selected one of the opposing and spaced major surfaces, in intimate contact and spaced from the opposed major surface of the other substrate. An active device is formed in the first substrate with a region electrically connected to the conductor layer. A contact region is exposed at the second major surface of the first substrate and extends through the first substrate and into electrical contact with the conductor layer.

31 Claims, 9 Drawing Sheets

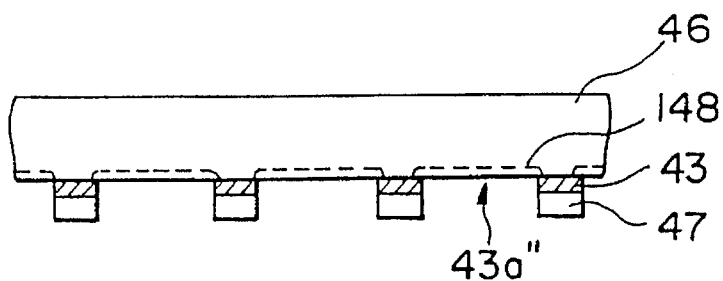
FIG. 7(A)
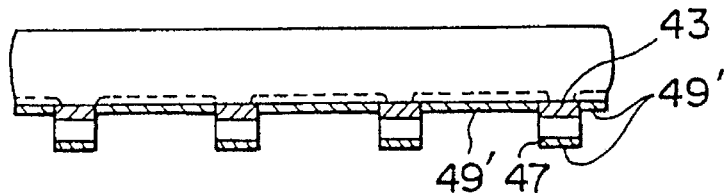
FIG. 7(B)
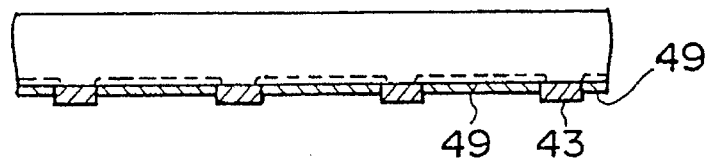
FIG. 7(C)
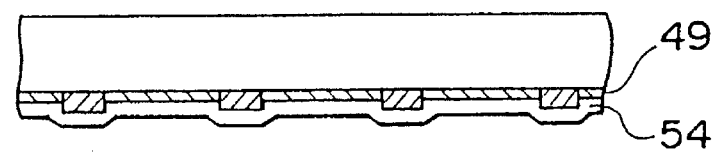
FIG. 7(D)
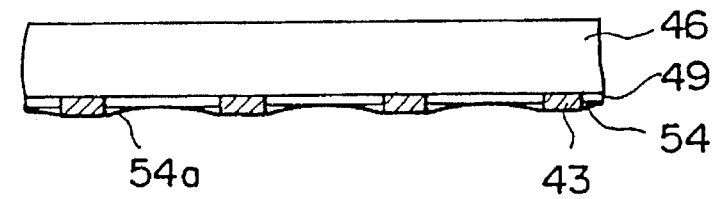
FIG. 7(E)
FIG. 7(G)
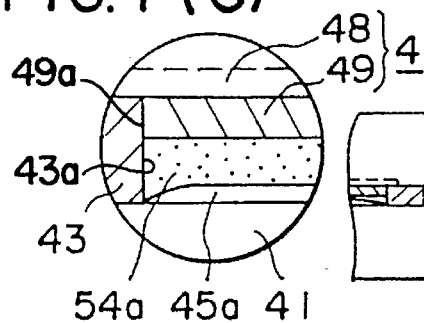
FIG. 7(F)
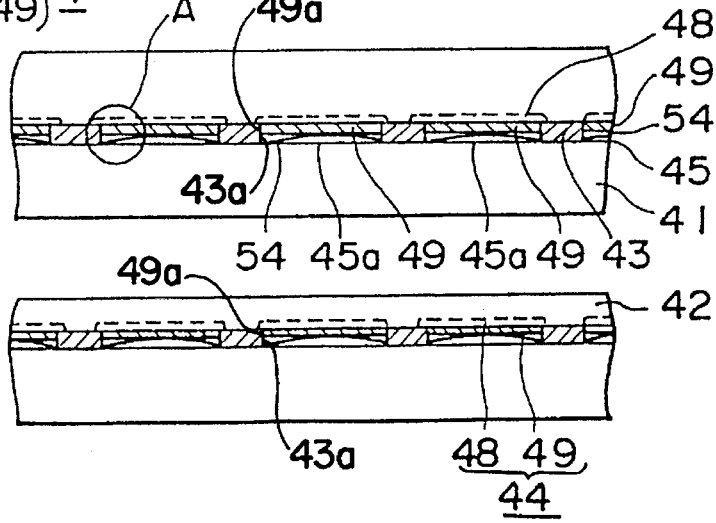
FIG. 7(H)

SOI DEVICE HAVING A BURIED LAYER OF REDUCED RESISTIVITY

This application is a continuation, of application Ser. No. 08/150,253, filed Nov. 10, 1993, now abandoned which is a continuation of Ser. No. 07/787,911 filed Nov. 5, 1991, now abandoned.

BACKGROUND OF THE INVENTION

The present invention generally relates to semiconductor devices and more particularly to a fabrication process of an SOI (semiconductor-on-insulator) device, wherein a buried layer of reduced resistivity is provided.

The bipolar transistors generally have a buried collector layer of increased impurity concentration level under the collector layer to reduce the collector resistance. When constructing such a bipolar transistor on a semiconductor layer formed on an insulating substrate, one encounters a difficulty in forming such a buried collector contact layer.

FIGS. 1(A)–1(C) show a conventional process for forming such a buried low-resistivity layer in the SOI device.

Referring to FIG. 1(A), a silicon oxide layer 12 is formed to cover a support substrate 11 of silicon, for example, and a tungsten layer 13 is deposited on the upper major surface of the silicon oxide layer 12. Further, a silicon single crystal layer 14 is placed on the upper major surface of the tungsten layer 13 as shown in FIG. 1(B), and the structure of FIG. 1(B) is held at a temperature that causes a reaction between the silicon layer 14 and the tungsten layer 13. Typically, the structure of FIG. 1(B) is held at about 1100° C. As a result of the reaction, a silicide layer 15 is formed under the silicon layer 14. This silicide layer 15 has a low resistivity and is used for the buried low-resistivity layer of the active devices formed on the semiconductor layer 14.

In this conventional process, there exists a problem in that a stress tends to develop at an interface between the silicide layer 15 and the silicon oxide layer 12 particularly when the control of the temperature for reacting the tungsten layer 13 and the silicon layer 14 is poor or when the duration of the reaction is longer than an optimum duration. Thereby, there is a substantial risk that the silicide layer 15 and the silicon oxide layer 12 will separate from each other. When this occurs, the yield of the device is inevitably decreased.

SUMMARY OF THE INVENTION

Accordingly, it is a general object of the present invention to provide a novel and useful semiconductor device and a fabrication process thereof, wherein the foregoing problems are eliminated.

Another and more specific object of the present invention is to provide a process for fabricating a semiconductor device on a substrate covered by an insulation layer, wherein a buried low-resistivity layer is formed under a semiconductor layer on which active devices are formed.

Another object of the present invention is to provide a semiconductor device and a fabrication process thereof, wherein the semiconductor device comprises: an insulation layer having upper and lower major surfaces provided on a support substrate; a semiconductor layer having upper and lower major surfaces and provided on the upper major surface of the insulation layer with a separation therefrom; a spacer region provided between the lower major surface of the semiconductor layer and the upper major surface of the insulation layer to form said space; a low-resistivity layer provided on either the upper major surface of the insulation layer or the lower major surface of the semiconductor layer in correspondence to the space as a buried low-resistivity layer; and an active device provided on the semiconductor layer. According to the present invention, the buried low-resistivity layer is provided in correspondence to the space formed between the insulation layer and the semiconductor layer, and the problem associated with the heat treatment to form the silicide layer is eliminated. More specifically, the buried low-resistivity layer is formed by depositing a silicide layer at the bottom of the depression by sputtering and patterning the same subsequently. In this process, the heat treatment to form the silicide layer is eliminated. In a preferred embodiment, the depression is filled by a polysilicon layer that forms a contact region extending from the buried-low resistivity layer to the surface of the semiconductor layer. Alternatively, the depression may be made vacant.

Other objects and further features of the present invention will become apparent from the following detailed description read in conjunction with the attached drawings.

BRIEF DESCRIPTION OF THE DRAWINGS

FIG. 7(A)–7(H) are diagrams showing still another process for fabricating the semiconductor device of the second embodiment.

DETAILED DESCRIPTION

FIGS. 2(A)–2(E) show the process for fabricating a semiconductor device according to a first embodiment of the present invention.

Figure 1A:
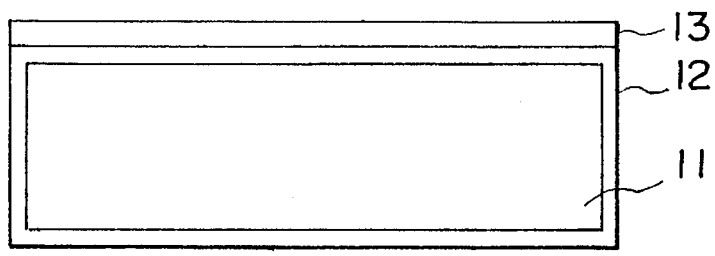
FIGS. 1(A)–1(C) are diagrams showing a conventional process for fabricating an SOI device having a buried low-resistivity region.
Figure 1B:
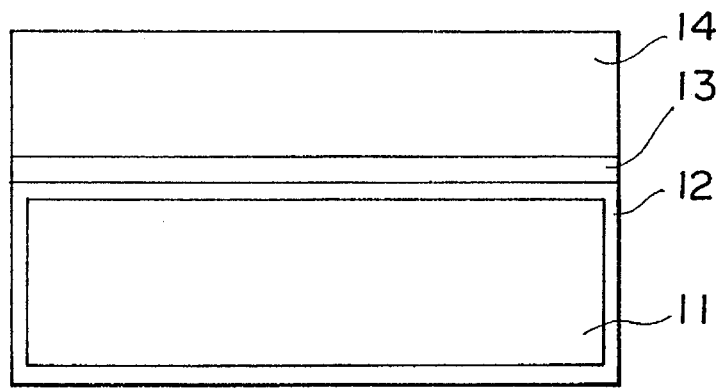
Figure 1C:
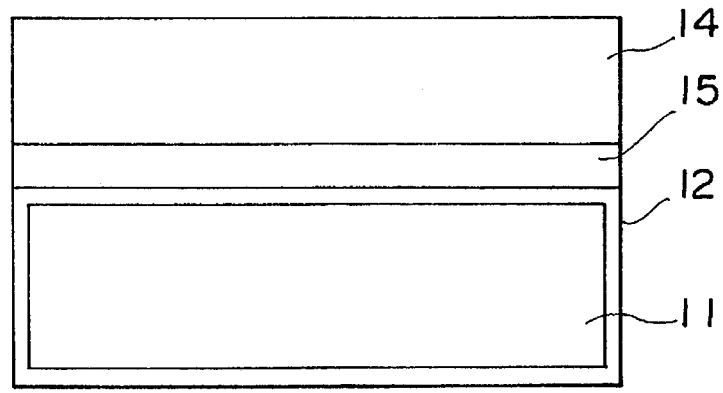
Figure 2A:
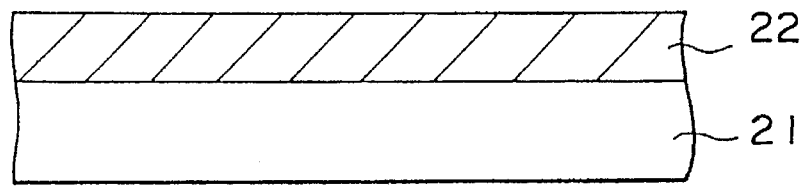
FIGS. 2(A)–2(J) are diagrams showing the process for fabricating a bipolar transistor on an SOI substrate together with a buried collector layer of reduced resistivity according to a first embodiment of the present invention.

Referring to FIG. 2(A), a first silicon oxide layer 22 is formed on the upper surface of a support substrate 21 of silicon with a thickness of about 1.2 μm by a thermal oxidation process.

Figure 2B:
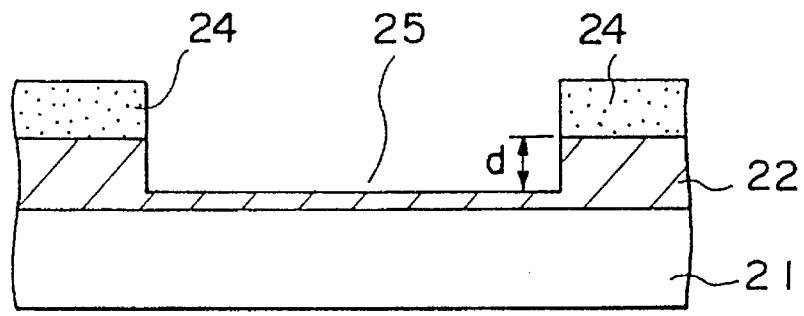

In the next step of FIG. 2(B), a photoresist layer 24 is provided on the upper major surface of the first silicon oxide layer 22 and subsequently is patterned to expose a part of the upper major surface the silicon oxide layer 22, and a reactive ion etching (RIE) process is applied to the thus-exposed part. Thereby, a depression 25 is formed in the silicon oxide layer 22 defined by sidewalls 22a of the layer 22 as illustrated in FIG. 2 (B) with a depth d of about 800 nm. Typically, a fluoride etching gas is used for the RIE process.

After the photoresist 24 is removed, a tungsten silicide (WSi) layer 26 is deposited on the silicon oxide layer 22 including the depression 25 by a CVD process or a sputtering process. Typically, the silicide layer 26 is deposited with a thickness of 300 nm. Further, ion implantation of arsenic (As$^+$) into the tungsten silicide layer 26 is conducted under the energy of 30 keV and the dose of $1\times10^{16}/cm^2$. See FIG. 2(C).

Next, a photoresist layer is deposited and subsequently patterned to form a resist mask 27 that covers the silicide layer 26 in correspondence to the part that is located in the depression 25. Further, an RIE process is applied to remove the silicide layer, 26, selectively with respect to the underlying silicon oxide layer except for the part that is protected by the patterned resist mask 27 in the depression 25. Typically, the RIE process is achieved by using a chloride etching gas. Thereby, a structure shown in FIG. 2(D) is obtained, in which the patterned portion of the silicide layer 26, remaining on the exposed upper surface of the depression 25 in the insulating layer 22, has sidewalls 26a substantially perpendicular to the exposed upper surface thereof and defining a lateral boundary of the patterned resistivity layer 26; the sidewalls 26a are spaced from the sidewalls 22a of the insulating layer 22, defining a space therebetween.

Figure 2C:
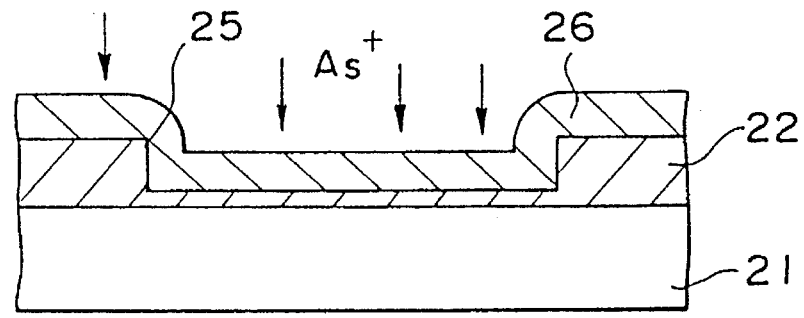
Figure 2D:
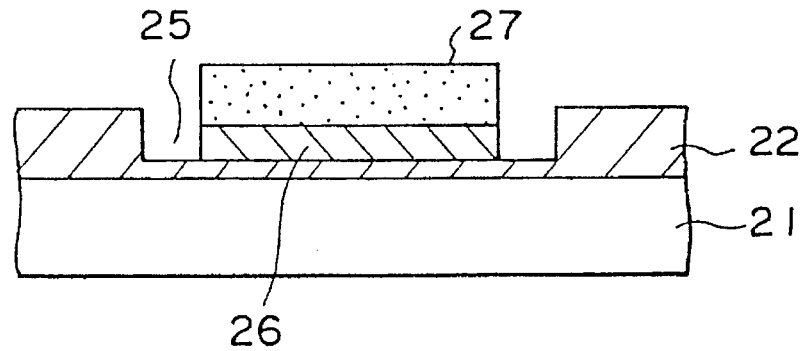
Figure 2E:
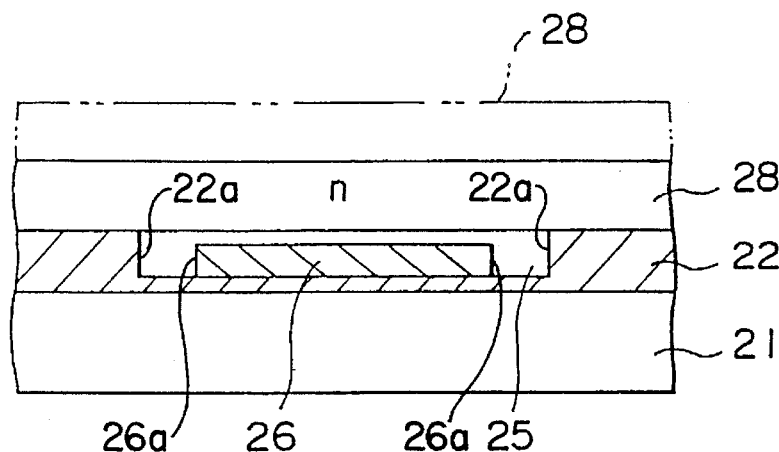

Next, a semiconductor layer 28 of single crystal silicon doped to the n-type is provided on the structure obtained in the step of FIG. 2(D) and heated at a temperature of about 1000° C. Thereby, the silicon layer 28 is firmly bonded to the silicon oxide layer 22. Further, the upper major surface of the silicon layer 28 is subjected to a polishing process to reduce the thickness to about 500 nm. See FIG. 2(E).

Figure 2F:
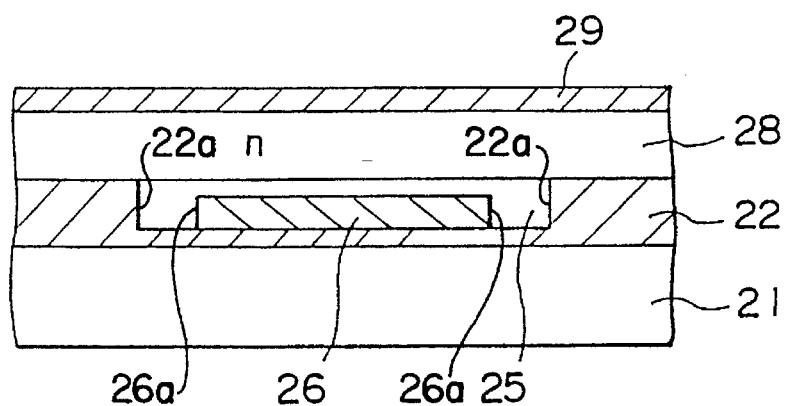
Figure 2G:
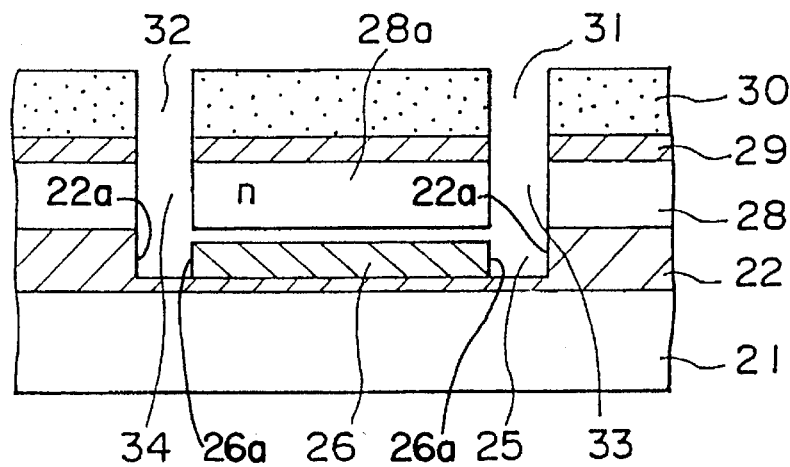
Figure 2H:
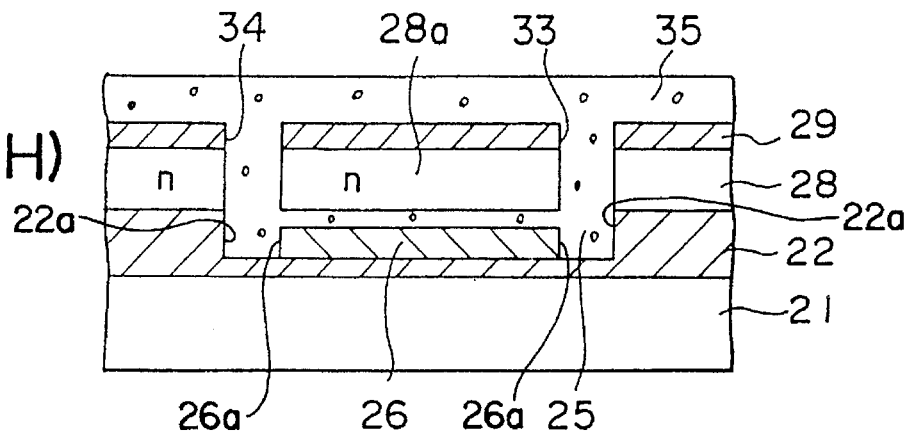

After the layer 28 is thus formed and polished, a second silicon oxide layer 29 is deposited on the layer 28 by a CVD process with a thickness of about 200 nm as shown in FIG. 2(F). Further, a photoresist 30 is applied on the upper major surface of the silicon oxide layer 29 as shown in FIG. 2(G), and a pair of elongated windows 31 and 32 are formed in the photoresist 30 in correspondence to the spaces between the sidewalls 22a of the depression 25 and the lateral boundaries 26a of the silicide pattern 26. Through these windows 31 and 32, an RIE process is applied against the silicon oxide layer 29 and further against the silicon layer 28 to form openings 33 and 34 in correspondence to the windows 31 and 32, until the openings reach the space 25. Thereby, the structure shown in FIG. 2(G) is obtained. In the structure of FIG. 2(G), it should be noted that the part 28a, of the silicon layer 28, that is located above the silicide region 26 forms a bridge structure that extends across the space 25.

Next, a deposition of polysilicon is achieved through the openings 33 and 34 by a reduced-pressure CVD process, and a polysilicon layer 35 is formed to fill the space 25 left between the silicide region 26 and the part 28 a of the silicon layer 28 located immediately above the silicide region 26 as well as the openings 33 and 34. See the structure of FIG. 2(H).

Next, the polysilicon layer 35 is polished until the silicon oxide layer 29 is exposed, and the structure thus obtained is subjected to a heat treatment at about 900° C. Thereby, the arsenic ions that are implanted in the silicide region 26 in the step of FIG. 2(C) are diffused into the polysilicon layer 35 and further into a bottom portion of the silicon layer part 28a that is used for the active layer or device layer of the semiconductor device. See the structure of FIG. 2(I).

Figure 2I:
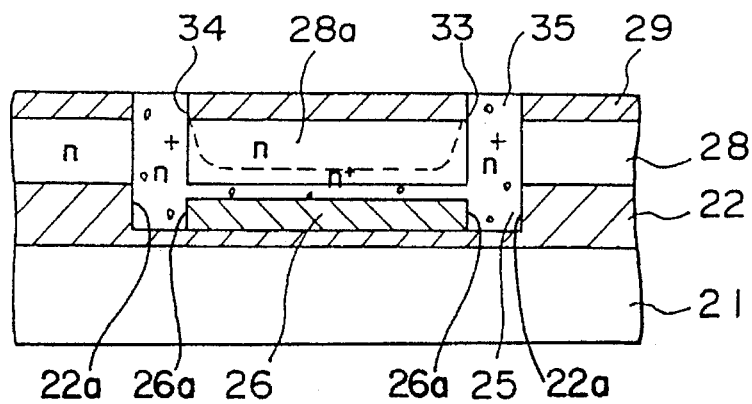

In this heat treatment, it should be noted that the diffusion of arsenic ions occurs more easily in the polysilicon layer 35 than in the single crystal silicon layer part 28a, and the polysilicon layer 35 is doped to the n$^+$-type up to the part that fills the openings 33 and 34. Of course, the bottom portion of the silicon layer part 28a is doped also to the n$^+$-type as shown in FIG. 2(I). Thereby, it should be noted that the silicide region 26 in FIG. 2(I) forms a buried low-resistivity layer that is located under the device layer 28a and connected to the surface of the layer part 28a by the channel provided by the doped polysilicon layer 35 that acts as a collector contact region. It should be noted that the polysilicon layer 35 thus doped by the diffusion of the arsenic ions from the doped silicide region 26 has the sheet resistance of 4–5 Ω/ that is substantially lower than the value normally achieved by the ion implantation.

Figure 2J:
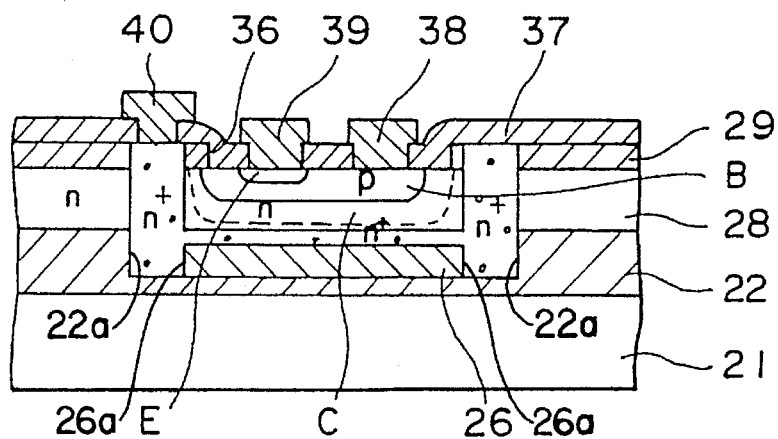

In the step of FIG. 2(J), a bipolar transistor is formed on the structure of FIG. 2(I). More specifically, the portion of the device layer part 28a that is doped to the n-type is used for the collector region C of the bipolar transistor, and the base region B is formed in the device layer part 28a by incorporating a p-type dopant. When doping the base region B and the emitter region E, the silicon oxide layer 29 is removed from the device region 28a. Further, the emitter region E of the n-type is formed in the base region B. After the base region B and the emitter region E are formed as such in the device region 73, a silicon oxide layer 37 is deposited and patterned to expose the base region B and the emitter region E. Further, the silicon oxide layer 37 is patterned to expose the polysilicon collector contact region 35, and a base electrode 38, an emitter electrode 39 and a collector electrode 40 are provided respectively in contact with the base region B, the emitter region E and the collector contact region 35.

The bipolar transistor thus formed has a reduced collector resistance because of the silicide region 26 formed immediately under the collector region C. Further, the resistance between the collector region C and the silicide region 26 is reduced by the increased carrier density that is achieved by the diffusion of the dopants from the silicide region 26. In the fabrication process described, the formation of the silicide region 26 does not include the heating process and hence the problems, such as the silicide region 26 coming off upon heat treatment, do not occur. Of course, the silicide region 26 is not limited to tungsten silicide as described but other silicide of refractory metals such as titanium silicide and molybdenum silicide may also be used.

Figure 3A:
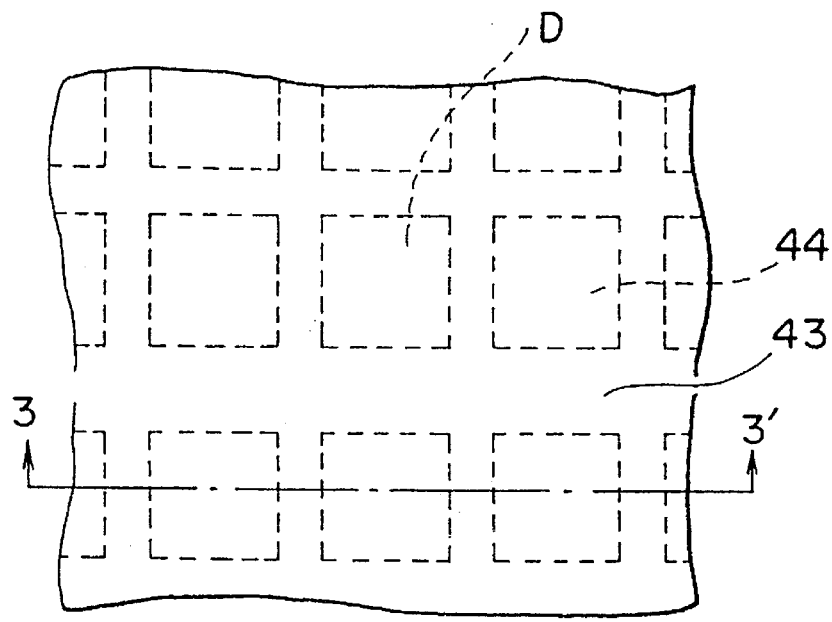
FIGS. 3(A) and 3(B) are diagrams showing the structure of a semiconductor device according to a second embodiment of the present invention, respectively in a plan view and a cross sectional view.
Figure 3B:
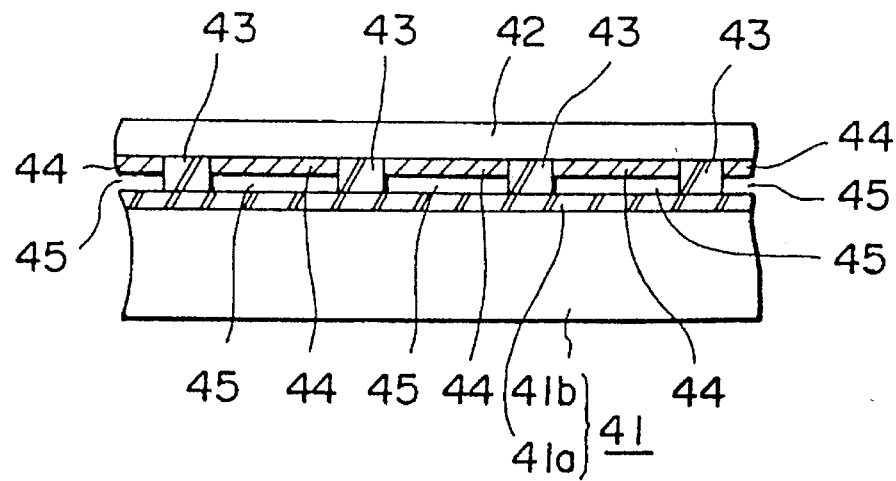

Next, a second embodiment of the present invention will be described with reference to FIGS. 3(A) and 3(B), wherein FIG. 3(A) shows a plan view and FIG. 3(B) shows a cross sectional view taken along a line 3—3'.

Referring to the plan view of FIG. 3(A), the semiconductor device of the present invention includes a number of device regions D formed in a silicon single crystal device layer 42 in rows and columns, wherein there is formed a low-resistivity layer 44 under the device layer 42 in correspondence to each device region D.

Referring to the cross sectional view of FIG. 3(B), there is provided a silicon wafer 41b on which a silicon oxide layer 41a is formed. The thickness of the silicon oxide layer 41a is arbitrary and may be selected to about 1 μm.

On the silicon oxide layer 41a, a silicon oxide spacer region 43 is provided in a grid pattern of spaces 45 surrounded by sidewalls 43a of the grid 43, in correspondence to the device regions D, and the device layer 42 is provided on the spacer region 43. Thereby, there are formed a number of spaces 45 between the silicon oxide layer 41a that covers the silicon wafer 41b and the low-resistivity layer 44 in correspondence to the device regions D. Further, in each device region D, there is provided a low-resistivity layer 44 on the lower major surface of the device layer 42. The active devices are formed on the device layer 42 in correspondence to each of the device regions D. As the semiconductor device is formed on the device layer 42 that is isolated from the silicon substrate 41b by the silicon oxide layer 41a and the insulating spacer region 43, the device of the present invention provides an effect substantially identical with the SOI devices.

Figure 4A:
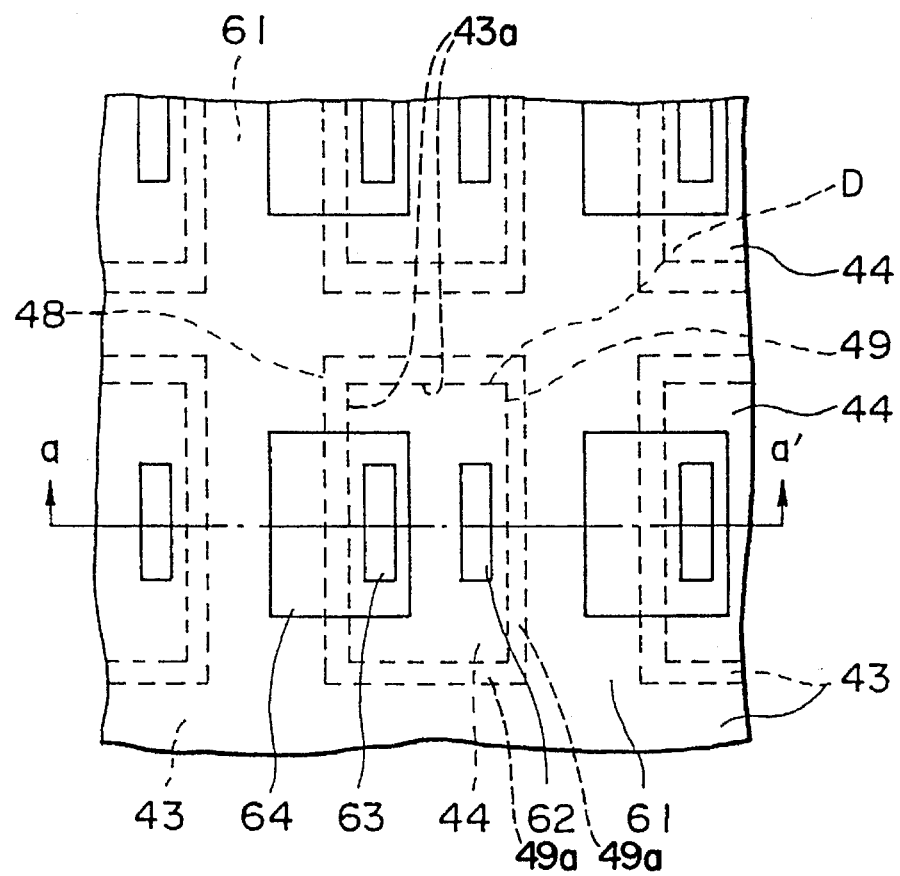
FIGS. 4(A) and 4(B) are diagrams showing a bipolar transistor as an example of the device of the second embodiment.
Figure 4B:
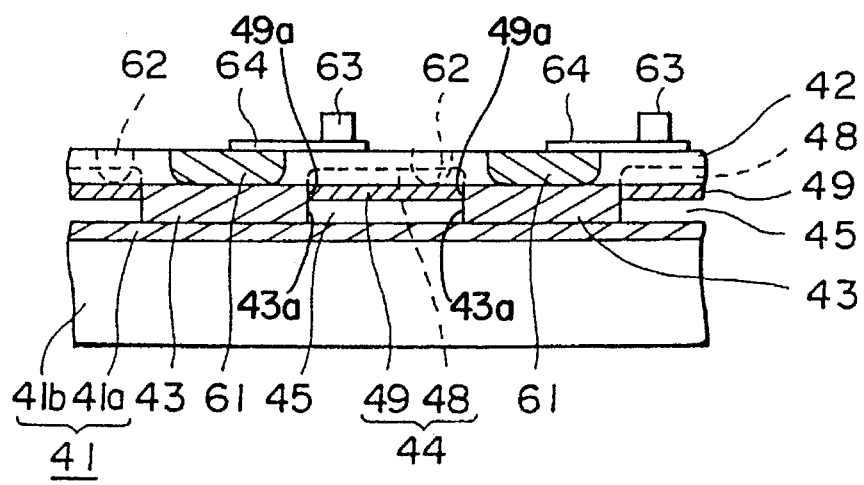

FIGS. 4(A) and 4(B) are diagrams showing an example of the bipolar transistor formed on the structure of FIGS. 3(A) and 3(B), respectively in the plan view and the cross sectional view.

Referring to the cross sectional view of FIG. 4(B), there is formed an insulating device isolation region 61 in the device layer 42 so as to surround each device region D in correspondence to the grid-shaped spacer region 43, wherein the isolation region 61 extends from the upper major surface to the lower major surface of the device layer 42 and establishes a contact with the grid-shaped spacer region 43 at the lower major surface of the device layer 42. The isolation region 61 may be formed by the ion implantation of oxygen ions.

On the upper major surface of the device layer 42, a base layer 64 is deposited and an emitter layer 63 is formed on the upper major surface of the base layer 64 in contact thereto. Further, there is formed a region 49 of low-resistivity having a vertical sidewall 49a defining a lateral boundary thereof and disposed at the lower major surface of the device layer 42 in correspondence to each space 45, and a diffusion region 48 is formed in the device layer 42 in correspondence to the part adjacent to the low-resistivity region 49. Thereby, the part of the device layer 42 that is located between the base region 64 and the diffusion region 48 forms the collector of the bipolar transistor. The low-resistivity region 49 and the diffusion region 48 form together the low-resistivity region 44 of FIG. 3(B). Typically, the region 49 may be formed of a silicide of refractory metals such as tungsten silicide, molybdenum silicide, and the like. Alternatively, one may use these refractory metals as the low-resistivity region 49.

Furthermore, there is formed a collector contact region 62 to which extends from the lower major surface to the upper major surface of the device layer 42 in correspondence to the part where the region 49 is formed and provides a current path extending from the low-resistivity region 49 to the surface of the device layer 42.

FIG. 4(A) shows the plan view of the structure of FIG. 4(B), wherein it will be seen that the base region 64 is formed with a rectangular shape, and the emitter region 63 also of a rectangular shape but having a reduced size is provided on the base region 64. Further, there is formed a rectangular opening of the collector contact region 62.

In the present device, too, one can reduce the collector resistance significantly by providing the low-resistivity region 49 under the collector region and providing a channel of the current by the collector contact region 62. The only structural difference from the device of the first embodiment is that the low-resistivity region 49 is provided at the lower major surface of the device layer 42 and the space 45 formed under the device layer 42 remains vacant.

In the device of the present embodiment, it will be noted that the low-resistivity region 49 is not used for connecting the device layer 42 and the silicon wafer 41b mechanically. Thereby, the silicide region 49 is free from mechanical stresses and the risk of the silicide region 49 coming off from the lower major surface of the device layer 42 is substantially eliminated. Further, the region 49 can be formed with uniform thickness. As will be explained below, any suitable material having a sufficiently low resistivity can be used for the low-resistivity region 49. Thereby, one can reduce the thickness of the region 49 and hence the thickness of the region 43, and the fabrication of the SOI structure becomes easier.

Hereinafter, a fabrication process of the device of the second embodiment will be described with reference to FIGS. 5(A)–5(E).

Figure 5A:
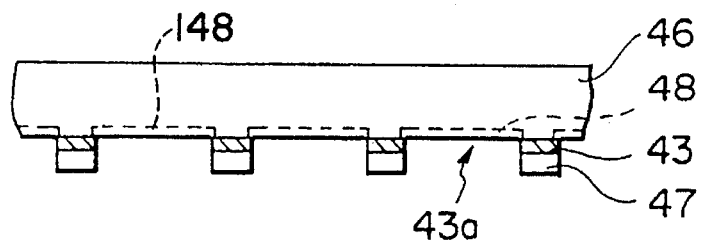
FIGS. 5(A)–5(E) are diagrams showing the process for fabricating the semiconductor device of the second embodiment.

Referring to FIG. 5(A), a silicon oxide layer is formed on the lower major surface of a silicon wafer 46 that has a thickness of about 500 µm. Further, a photoresist is applied on the lower major surface of the silicon oxide layer and patterned to form a resist pattern 47 that corresponds to the grid-shaped spacer region 43. Further, an etching process is applied to the lower major surface of the silicon oxide layer while using the patterned resist 47 as a mask to form the spacer region 43 and a depression region 43a that is surrounded by the spacer region 43. Further, an ion implantation is applied to the depression region 43a while using the patterned resist 47 as a mask. Thereby, a doped region 148 is formed in correspondence to the depression region 43a.

Figure 5B:
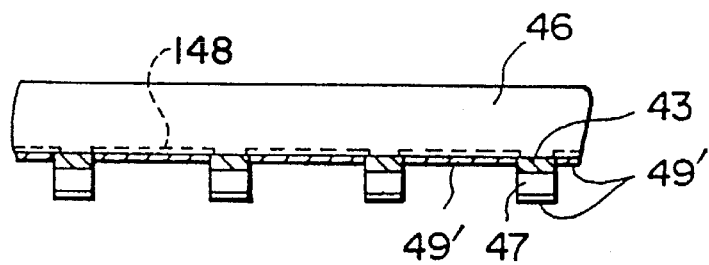
Figure 5C:
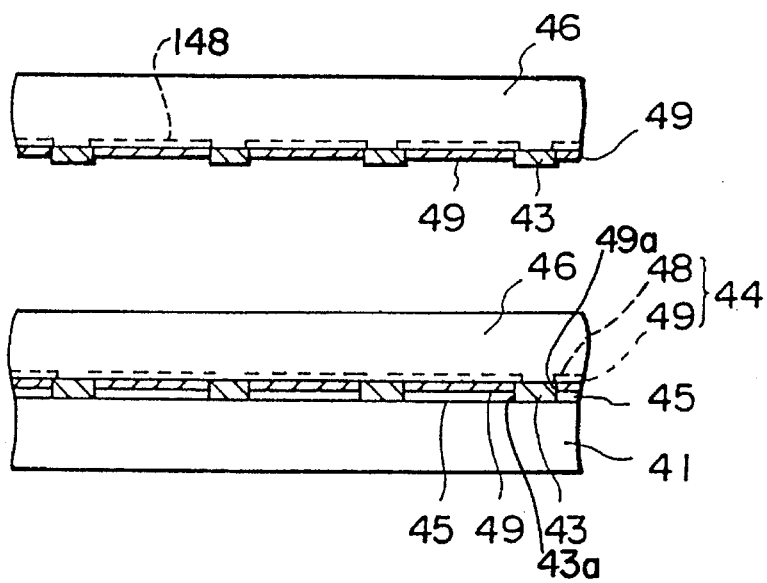

In the step of FIG. 5(B), a layer 49' of silicide or metal is deposited on the lower major surface of the wafer 46, including the patterned resist 47 and the depression region 43a with a thickness of about 500 nm. Further, the layer 49' that is deposited on the patterned resist 47 is lifted off by removing the resist 47. Thereby, a structure shown in FIG. 5(C) is obtained. It should be noted that one can use a refractory metal such as tungsten, tantalum or molybdenum for the layer 49 in place of silicide.

Figure 5D:
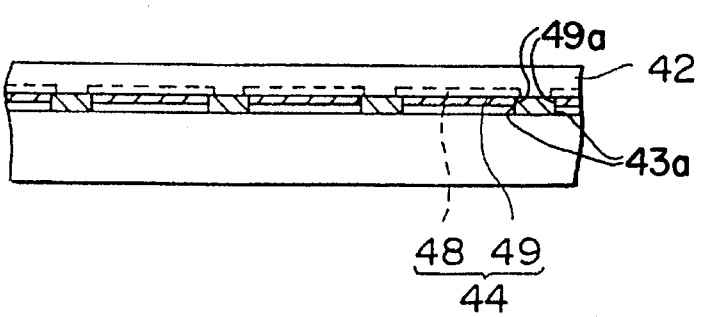

In the step of FIG. 5(D), a silicon support substrate 41 is attached to the bottom surface of the wafer 46. There, the upper major surface of the silicon substrate 41 establishes a contact with the lower major surface of the spacer region 43, and the space 45 is formed between the lower major surface of the layer 49 and the upper major surface of the substrate 41. The structure of FIG. 5(D) is subsequently heat treated such that the support substrate 41 is firmly bonded to the silicon oxide spacer region 43. Simultaneously, the impurities in the doped region 148 diffuse into the silicon wafer 46 and form the diffusion region 48. Further, it is possible to convert the metal forming the low-resistivity region 49 to a silicide upon the heat treatment by suitably choosing the condition of heat treatment.

Figure 5E:
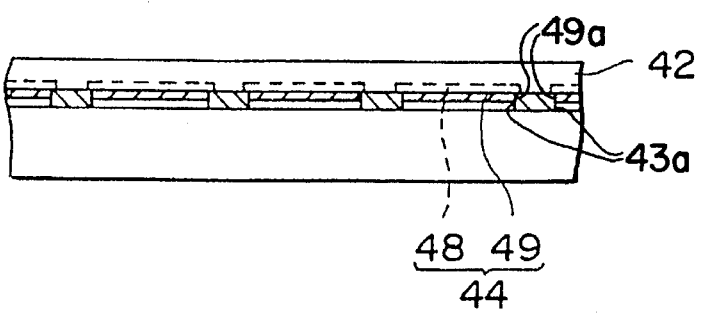

In the step of FIG. 5(E), the thickness of the silicon wafer 46 is reduced to about 500 nm by polishing to form the device layer 42. Further, various devices are formed on the device layer 42 according to the well known processes such as the one described with reference to the first embodiment.

FIGS. 6(A)–6(E) show another process for fabricating the device of the second embodiment.

Figure 6A:
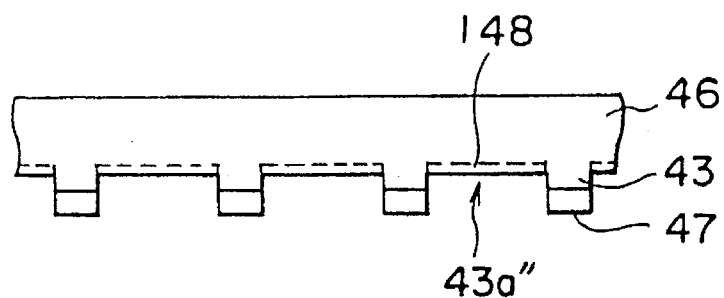
FIGS. 6(A)–6(E) are diagrams showing another process for fabricating the semiconductor device of the second embodiment.

Referring to FIG. 6(A), a photoresist is applied to the bottom surface of the silicon wafer 46 and patterned subsequently to form a patterned resist 47 in correspondence to the grid-shaped spacer region 43. Further, while using the resist 47 as the mask, an etching process is applied to the bottom surface of the silicon wafer 46 to form a depression region 43a' defined by a surrounding sidewall 43a of the spacer region 43 that is now formed as a part of the silicon wafer 46. Compare the structure of FIG. 6(A) with the structure of FIG. 5(A), wherein the spacer region 43 of the latter structure is formed of silicon oxide. After the depression region 43a' is thus formed, an ion implantation of impurities is achieved into the depression region 43a' while using the patterned resist 47 as a mask.

Figure 6B:
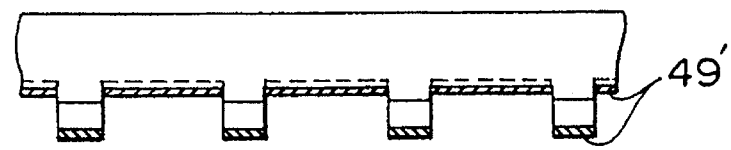
Figure 6C:
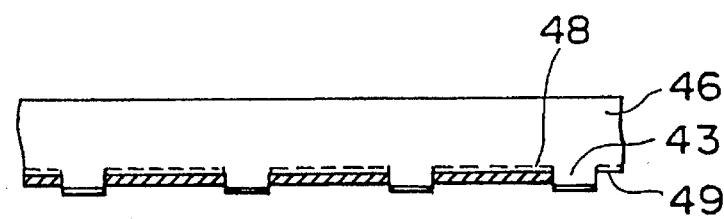

In the step of FIG. 6(B), the layer 49' of metal or silicide is deposited on the bottom surface of the structure of FIG. 6(A), including the depression region 43a' and the patterned resist 47. Further, in the step of FIG. 6(C), the layer 49' that covers the patterned resist 47 is lifted off by removing the resist 47. Thereby, the low-resistivity region 49 is formed in correspondence to the depression region 43a' and again has a vertical sidewall 49a defining a lateral boundary thereof.

Figure 6D:
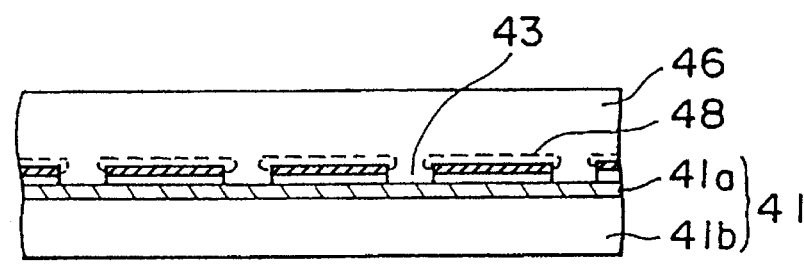

In the step of FIG. 6(D), a support substrate identical in construction with the support substrate 41 and comprising the silicon substrate 41b and the silicon oxide layer 41a is attached to the bottom surface of the silicon wafer 46 such that the upper major surface of the silicon oxide layer 41a establishes an intimate contact with the lower major surface of the spacer region 43. Further, the structure of FIG. 6(D) is subjected a heat treatment, and the support substrate 41 is bonded firmly against the silicon wafer 46. Upon the heat treatment, the impurities doped into the impurity region 48 diffuse into the silicon wafer 46 similarly to the previously explained process and the diffusion region 48 is formed.

Figure 6E:
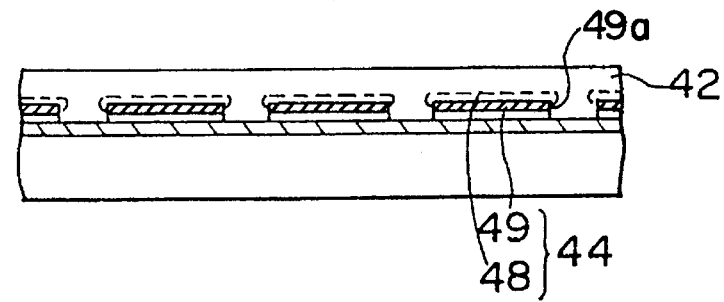

After the structure of FIG. 6(D) is thus formed, the silicon wafer 46 is subjected to the polishing process to reduce the thickness to about 1 μm, and the device layer 42 is obtained as shown in FIG. 6(E).

According to the fabrication process described above, one can eliminate the process for forming the silicon oxide layer for the spacer region 43, and the problem of deterioration in the quality of the crystal of the device layer 42 at the interface between the spacer region 43 and the device layer 42 as in the case of the device formed by the process of FIGS. 5(A)–5(E), is eliminated.

Next, a still other process for fabricating the semiconductor device of the second embodiment will be described with reference to FIGS. 7(A)–7(H).

In the present process, the steps of FIGS. 7(A)–7(C) are achieved similar to the steps of FIGS. 5(A)–5(C). After the structure of FIG. 7(C) is formed, a polysilicon layer 54 is deposited on the bottom surface of the structure of FIG. 7(C) as shown in FIG. 7(D) such that the polysilicon layer 54 covers the low-resistivity region 49 and buries the spacer region 43.

Next, the polysilicon layer 54 is polished starting from the lower major surface thereof until the silicon oxide spacer region 43 is exposed. Preferably, a urethane pad is used for polishing in combination with colloidal silica abrasives. After the spacer region 43 is exposed, the polishing is continued for another 10 minutes and the structure shown in FIG. 7(E) is obtained, wherein a polysilicon layer 54a having a concave lower major surface is left (i.e., remains) in correspondence to the marginal part of the depression 43a" defined by sidewalls 43a.

Further, in the step of FIG. 7(F), a silicon substrate corresponding to the substrate 41 is attached to the bottom surface of the structure of FIG. 7(E), and there is formed a space 45a between the upper major surface of the substrate 41 and the concaved lower major surface of the polysilicon layer 54a. See the enlarged view of FIG. 7(G). In this state, the silicon substrate 41 is bonded to the spacer region 43 by heating, similar to the previous embodiments. Preferably, the bonding of the substrate 41 is achieved under a reduced pressure condition to avoid damaging of the wafer 46 due to the dilation of the air in the space 45a. As best seen in the enlarged view of FIG. 7(G), the low-resistivity region 49 has a vertical sidewall 49a defining a lateral boundary thereof, contiguous the corresponding vertical sidewall 43a of the spacer region 43.

Next, in the step of FIG. 7(H), the silicon wafer 46 is polished such that the thickness is reduced to form a device layer 42 having a thickness of about 500 nm. Further, various active devices are formed on the device layer 42 according to the well known process.

According to the present invention, the low-resistivity layer 49 is reinforced by the polysilicon layer 54a and the mechanical stability of the structure is increased, in addition to the reduction in the collector resistance.

Further, the present invention is not limited to the embodiments described heretofore, but various variations and modifications may be made without departing from the scope of the invention.

What is claimed is:

1. A semiconductor device, comprising:

a first substrate having upper and lower major surfaces;

a second substrate having upper and lower major surfaces;

means for supporting the first and second substrates such that the lower major surface of the first substrate and the upper major surface of the second substrate are in parallel relationship and define a space therebetween of a first dimension, in a first direction, perpendicular to the respective upper and lower major surfaces of the second and first substrates;

a conductor layer formed of a first material of low resistivity and having upper and lower major surfaces defining a thickness of the conductor layer in the first direction, which is less than the first dimension, the conductor layer being disposed in the space between, and supported on a selected one of, the lower major surface of the first substrate and the upper major surface of the second substrate, the conductor layer further being defined by a lateral boundary extending from the exposed major surface thereof to the selected one of the lower major surface of the first substrate and the upper major surface of the second substrate on which the conductor layer is supported;

a contact region formed of a second material which is conductive and is different from the first material of low resistivity, the contact region being exposed at the upper major surface of the first substrate extending through the first substrate to, and into intimate electrical contact with the conductor layer; and an active device formed on the first substrate and having a region electrically connected to the conductor layer.

2. A semiconductor device as claimed in claim 1, wherein:

said supporting means comprises an insulation layer extending between and interconnecting the lower major surface of the first substrate and the upper major surface of the second substrate and supporting same in the parallel and spaced relationship, the insulation layer having a depression therein, the depression defining a corresponding, reduced thickness portion of the insulation layer on the upper major surface of the second substrate, the reduced thickness portion having an exposed surface parallel to and spaced from the lower major surface of the first substrate by a space of a second dimension in the first direction which is less than the first dimension;

the conductor layer being formed on the exposed surface of the insulator layer and the thickness thereof being less than the second dimension, the conductor layer accordingly having an exposed upper surface which is parallel to and spaced from the lower major surface of the first substrate by a space of a third dimension which is less than the second dimension.

3. A semiconductor device as claimed in claim 2, further comprising:

a contact hole extending through the first substrate, including the upper and lower major surfaces thereof, and forming a passageway connecting to the space of the second dimension; and the contact region comprises doped polysilicon deposited within and filling the contact hole and the spaces of the second and third dimensions and thereby being in intimate contact with the exposed major surface of the conductor layer and the lower major surface of the second substrate, the doped polysilicon furthermore being exposed at the upper major surface of the first substrate.

4. A semiconductor device as recited in claim 1 wherein the active device includes emitter, base and collector regions, the collector region comprising the region of the active device which is electrically connected to one of the upper and lower major surfaces of the conductor layer.

5. A semiconductor device as recited in claim 1, wherein:

the conductor layer is formed in intimate contact with a corresponding portion of the lower major surface of the first substrate and accordingly has an exposed lower major surface; and the corresponding portion of the lower major surface of the first substrate is doped, so as to have an increased carrier density therein, and electrically connects the region of the active device to the conductor layer.

6. A semiconductor device as claimed in claim 5, wherein the supporting means further comprises an insulating grid region contiguous with and surrounding the lateral boundary of the conductor layer and having a thickness of the first dimension and thereby extending between and mechanically interconnecting and thereby supporting the first and second substrates in the parallel, spaced relationship, the conductor layer thereby having an exposed lower major surface spaced from the upper major surface of the second substrate and defining a space therebetween.

7. A semiconductor device as claimed in claim 6, further comprising:

a polysilicon layer formed on the exposed lower major surface of the conductor layer, the polysilicon layer having a concave, exposed surface and thereby defining a complementary, convex space between the concave exposed surface thereof and the upper major surface of the second substrate.

8. A semiconductor device as claimed in claim 7, wherein:

the conductor layer is formed with the upper major surface thereof in intimate contact with a corresponding portion of the lower major surface of the first substrate; and the corresponding portion of the lower major surface of the first substrate is doped so as to have an increased carrier density therein.

9. The semiconductor device as claimed in claim 1 in which the first material of low-resistivity comprises a refractory metal.

10. The semiconductor device as claimed in claim 1 in which the first material of low-resistivity comprises a silicide of a refractory metal.

11. The semiconductor device as claimed in claim 1 wherein the second, conductive material forming the contact region comprises doped polysilicon.

12. A semiconductor device, comprising:

a support substrate, having an upper surface and a lower surface;

a semiconductor layer, having an upper surface and a lower surface;

an insulating layer of a thickness of a first dimension, formed on the upper surface of the support substrate and extending to the lower surface of the semiconductor layer and interconnecting the semiconductor layer with the support substrate and thereby supporting the semiconductor layer on the support substrate such that the lower surface of the semiconductor layer and the upper surface of the support substrate are in parallel relationship and spaced apart by the first thickness dimension of the insulating layer, the insulating layer further having a centrally located, depressed area therein, the depressed area being defined by a surrounding sidewall of the insulating layer and having an exposed upper surface spaced from the lower surface of the semiconductor layer by a space of a second dimension;

a low-resistivity layer formed on the exposed upper surface of the depressed area of the insulating layer, the low-resistivity layer being of a first composition and having a thickness substantially smaller than the first thickness dimension of the insulating layer and smaller than the space of the second dimension and thereby having an exposed upper surface spaced from the lower surface of the semiconductor layer by a space of a third dimension, said low-resistivity layer being defined by a lateral boundary which surrounds said low-resistivity layer, extending from the exposed upper surface thereof to the upper surface of the depressed area of the insulating layer on which it is formed, and which is spaced inwardly from the sidewall of the depressed area in the insulating layer and accordingly defines a surrounding space therebetween;

the semiconductor layer having an opening therein defining a passageway extending through the semiconductor layer to the space between the lateral boundary of the low-resistivity layer and the sidewall of the depressed area in the insulating layer;

a conductive material filling the opening and the spaces of the second and third dimensions and the surrounding space between the lateral boundary and the sidewall and intimately contacting, and thereby being electrically connected to, the low-resistivity layer, said conductive material being of a second composition different from the first composition of said low-resistivity layer; and an active device formed on the upper surface of the semiconductor layer and having a region electrically connected to the conductive material and thereby electrically connected to the low-resistivity layer.

13. The semiconductor device as claimed in claim 12 in which the low-resistivity layer comprises a refractory metal.

14. The semiconductor device as claimed in claim 12 in which the low-resistivity layer comprises a silicide of a refractory metal.

15. The semiconductor device as claimed in claim 12 wherein the conductive material comprises doped polysilicon.

16. The semiconductor device as claimed in claim 12 wherein a portion of the lower surface of the semiconductor layer, which directly faces the low-resistivity layer, is doped to have an increased carrier density.

17. A semiconductor device, comprising:

a first substrate, having an upper surface and a lower surface;

a second substrate, having an upper surface and a lower surface and having depressed regions in the lower surface thereof defined by respective, surrounding sidewalls of the second substrate, the remaining portions of the lower surface of the second substrate between adjacent sidewalls defining a grid and the depressed regions being doped so as to have an increased carrier density therein;

an insulating layer formed on the upper surface of the first substrate and engaging the remaining portions of the lower surface of the second substrate such that corresponding portions of the insulating layer are in opposed, spaced relationship with respect to the depressed regions of the second substrate;

the second substrate, further, being configured as a device layer and supported by the insulating layer on the first substrate, each depressed surface region of the lower surface of the device layer being in facing relationship with respect to a corresponding, facing portion of the insulating layer of the first substrate and being spaced therefrom by a space of a first dimension;

a low-resistivity layer formed on each depressed surface region of the lower surface of the device layer and having an exposed lower surface, the low-resistivity layer having a thickness of a second dimension, less than the first dimension, and defining a space of a third dimension between the lower surface thereof and the corresponding, facing portion of the upper surface of the first substrate, said low-resistivity layer further being defined by a lateral boundary that surrounds said low-resistivity layer, contiguous with the surrounding sidewall of the device layer defines the corresponding depressed region, and extends from the exposed lower surface thereof to the depressed surface of the depressed surface region of the device layer;

an active device formed on the upper surface of the device layer and including a collector region, formed in the semiconductor layer in contact with the doped, depressed area; and a collector contact region formed in said device layer as a part thereof in correspondence to each respective depressed surface region, said collector contact region defining an exposed contact region surface at the upper surface of the device layer and extending therethrough to the respective, doped depressed surface region.

18. The semiconductor device as claimed in claim 17 further comprising a polysilicon layer formed on the lower surface of the low-resistivity layer in the space of the third dimension, the polysilicon layer having a concave, exposed lower surface and thereby defining a cavity of a corresponding, convex configuration between the concave, exposed lower surface thereof and the facing portion of the upper surface of the first substrate.

19. A semiconductor device comprising:

a first substrate having upper and lower major surfaces;

a second substrate having upper and lower major surfaces such that the lower major surface of the first substrate and the upper major surface of the second substrate are in spaced, parallel relationship and define a space therebetween of a first dimension, in a direction perpendicular to the respective upper and lower major surfaces of the second and first substrates;

a conductor layer having opposite major surfaces and formed of a first material of low resistivity and having a thickness in the first direction which is less than the first dimension, the conductor layer being disposed in the space between, and supported by one of the major surfaces thereof on a selected one of, the lower major surface of the first substrate and the upper major surface of the second substrate and the other major surface thereof being exposed;

a contact region defining an exposed contact region surface at the upper major surface of the first substrate and extending through the first substrate to, and into intimate electrical contact with, the conductor layer, said contact region being formed of a second, conductive material different from the first material of the conductor layer;

an active device formed on the first substrate and having a region electrically connected to the connector layer; and said conductor layer being defined by a lateral boundary that surrounds said conductor layer and extends from the exposed major surface of the conductor layer to said selected one of the lower major surface of the first substrate and the upper major surface of the second substrate on which the conductor layer is formed.

20. A semiconductor device as claimed in claim 1, wherein said contact region extends through the first substrate in a direction perpendicular to the respective upper and lower major surfaces of the first substrate.

21. A semiconductor device as claimed in claim 20, wherein said contact region comprises polysilicon.

22. A semiconductor device as claimed in claim 12, wherein said two passageways extend through said semiconductor layer substantially perpendicularly to the upper and lower major surfaces of the semiconductor layer.

23. A semiconductor device as claimed in claim 22, wherein said conductive material comprises polysilicon.

24. A semiconductor device as claimed in claim 17, wherein said collector contact region extends substantially perpendicularly to the upper and lower major surfaces of the semiconductor layer and comprises a part of said semiconductor layer.

25. A semiconductor device as claimed in claim 19, wherein said contact region extends through the first substrate in a direction perpendicular to the respective upper and lower major surfaces of the first substrate.

26. A semiconductor device as claimed in claim 19, wherein said contact region comprises polysilicon.

27. A semiconductor device as claimed in claim 7, wherein the lateral boundary of said conductor layer is substantially perpendicular to both the lower major surface of the first substrate and the upper major surface of the second substrate.

28. A semiconductor device as claimed in claim 17, wherein the lateral boundary is substantially perpendicular to both the lower surface of the semiconductor layer and the upper surface of the support substrate.

29. A semiconductor device as claimed in claim 19, wherein the lateral boundary of said conductor layer is substantially perpendicular to both the lower major surface of the first substrate and the upper major surface of the second substrate.

30. A semiconductor device comprising:

a first substrate having upper and lower major surfaces;

a second substrate having upper and lower major surfaces;

an insulation layer extending between and interconnecting the lower major surface of the first substrate and the upper major surface of the second substrate and supporting same in parallel and spaced relationship, the insulation layer having a depression therein, defined by a sidewall surrounding a reduced thickness portion of the insulation layer, which reduced thickness portion is disposed on the upper major surface of the second substrate and has an exposed surface parallel to and spaced from the lower major surface of the first substrate;

a conductor layer of a first material of low resistivity formed on the exposed surface of the insulating layer and having an exposed surface which is parallel to and separated by a first space from the lower major surface of the first substrate, the conductor layer, further, being defined by a lateral boundary extending from the exposed surface of the conductor layer to the exposed surface of the insulating layer and which surrounds said conductor layer and is separated laterally from the sidewall of the depression by a second space, the second space being in communication with the first space;

a contact region comprising a contact hole extending through the first substrate from the upper surface thereof and to the first space and a second, conductive material which is different from the first material and which fills the contact hole and the first and second spaces, thereby defining an exposed contact region surface at the upper major surface of the first substrate and which is in intimate electrical contact with the conductor layer and the lower major surface of the first substrate; and an active device formed on the first substrate and having a region electrically connected by the second conductive material to the conductor layer and to the exposed contact region surface.

31. A semiconductor device, comprising:

a support substrate having an upper surface and a lower surface;

a semiconductor layer having an upper surface and a lower surface;

an insulating layer formed on the upper surface of the support substrate and extending to the lower surface of the semiconductor layer and thereby connecting the semiconductor layer to the support substrate, the insulating layer having a depressed area therein defined by a sidewall extending between the upper surface of the support substrate and the lower surface of the semiconductor layer and exposing respectively corresponding, opposed portions of the lower surface of the semiconductor layer and the upper surface of the support substrate, the exposed portion of the lower surface of the semiconductor layer being doped so as to define a doped region extending into the semiconductor layer from the exposed lower surface thereof and having an increased carrier density therein;

a low-resistivity layer, having a thickness less than the space between the upper surface of the support substrate and the lower surface of the semiconductor layer, formed on the exposed portion of the lower surface of the semiconductor layer and having a lower surface spaced from the upper surface of the support substrate and having a lateral boundary contiguous with the sidewall of the depressed area and thereby extending from the lower surface of the low-resistivity layer to the lower surface of the semiconductor layer;

an active device formed in the semiconductor layer from the upper surface thereof and including a collector region in contact with the doped region thereof; and a collector contact region formed in said semiconductor layer as a part thereof and extending from, and electrically connecting, the doped region to the upper surface of the semiconductor layer and defining an exposed contact region surface at the upper surface of the semiconductor layer.

* * * * *

UNITED STATES PATENT AND TRADEMARK OFFICE
CERTIFICATE OF CORRECTION

PATENT NO. : 5,621,239
DATED : Apr. 15, 1997
INVENTOR(S) : HORIE et al.

It is certified that error appears in the above-indentified patent and that said Letters Patent is hereby corrected as shown below:

Col. 3,  line 13, after "layer" delete ",";
line 14, after "layer" insert --,--.

Col. 5,  line 12, change "the" (first occurrence) to --a--;
line 44, delete "to" (first occurrence).

Col. 7,  line 19, after "subjected" insert --to--.

Col. 12, line 47 (Claim 27, line 1), change "7" to --1--.

Signed and Sealed this

Twenty-third Day of September, 1997

Attest:

BRUCE LEHMAN

Attesting Officer

Commissioner of Patents and Trademarks